(12) United States Patent
Park et al.

(10) Patent No.: US 8,664,015 B2
(45) Date of Patent: Mar. 4, 2014

(54) METHOD OF MANUFACTURING PHOTOELECTRIC DEVICE

(75) Inventors: Sang-Jin Park, Yongin-si (KR);
Min-Chul Song, Yongin-si (KR);
Sung-Chan Park, Yongin-si (KR);
Dong-Seop Kim, Yongin-si (KR);
Won-Gyun Kim, Yongin-si (KR);
Sang-Won Seo, Yongin-si (KR)

(73) Assignee: Samsung SDI Co., Ltd., Yongin-si, Gyeonggi-Do (KR)

( * ) Notice: Subject to any disclaimer, the term of this patent is extended or adjusted under 35 U.S.C. 154(b) by 18 days.

(21) Appl. No.: 13/568,462

(22) Filed: Aug. 7, 2012

(65) Prior Publication Data

US 2013/0095597 A1    Apr. 18, 2013

Related U.S. Application Data

(60) Provisional application No. 61/546,642, filed on Oct. 13, 2011.

(51) Int. Cl.
*H01L 21/00* (2006.01)

(52) U.S. Cl.
USPC ............................... 438/19; 438/45; 136/261

(58) Field of Classification Search
USPC ................... 438/19, 37, 45; 136/261
See application file for complete search history.

(56) References Cited

U.S. PATENT DOCUMENTS

| | | | |
|---|---|---|---|
| 6,998,288 B1 * | 2/2006 | Smith et al. | 438/48 |
| 8,222,516 B2 * | 7/2012 | Cousins | 136/255 |
| 2010/0197061 A1 | 8/2010 | Huh et al. | |
| 2010/0229925 A1 | 9/2010 | Kim et al. | |
| 2010/0304519 A1 * | 12/2010 | Eickelmann et al. | 438/68 |
| 2011/0126877 A1 * | 6/2011 | Kim et al. | 136/244 |
| 2011/0303280 A1 * | 12/2011 | Pawlak et al. | 136/256 |
| 2012/0138127 A1 * | 6/2012 | Kuo et al. | 136/255 |
| 2012/0199202 A1 * | 8/2012 | Prajapati | 136/261 |

FOREIGN PATENT DOCUMENTS

| | | |
|---|---|---|
| JP | 2009-246214 A | 10/2009 |
| JP | 2010-021424 A | 1/2010 |
| JP | 2010-074134 A | 4/2010 |
| KR | 10-2009-0107326 A | 10/2009 |
| KR | 10-2010-0032161 A | 3/2010 |
| KR | 10-2010-0128132 A | 12/2010 |
| KR | 10-2011-0020061 A | 3/2011 |
| KR | 10-2011-0040541 A | 4/2011 |
| KR | 10-2011-0042083 A | 4/2011 |
| WO | WO 2010/012062 A1 | 2/2010 |

* cited by examiner

*Primary Examiner* — William D Coleman
(74) *Attorney, Agent, or Firm* — Lee & Morse, P.C.

(57) ABSTRACT

A method of manufacturing a solar cell including providing a semiconductor substrate having a first conductivity type; performing a first deposition process that includes forming a first doping material layer having a second conductivity type different from the first conductivity type; performing a drive-in process that includes heating the substrate having the first doping material layer thereon; performing a second deposition process after performing the drive-in process and including forming a second doping material layer on the first doping material layer, wherein the second doping material layer has the second conductivity type; locally heating portions of the substrate, the first doping material layer, and the second doping material layer with a laser to form a contact layer at a first surface of the substrate; and forming a first electrode on the contact layer and a second electrode on a second surface of the substrate opposite to the first surface.

18 Claims, 15 Drawing Sheets

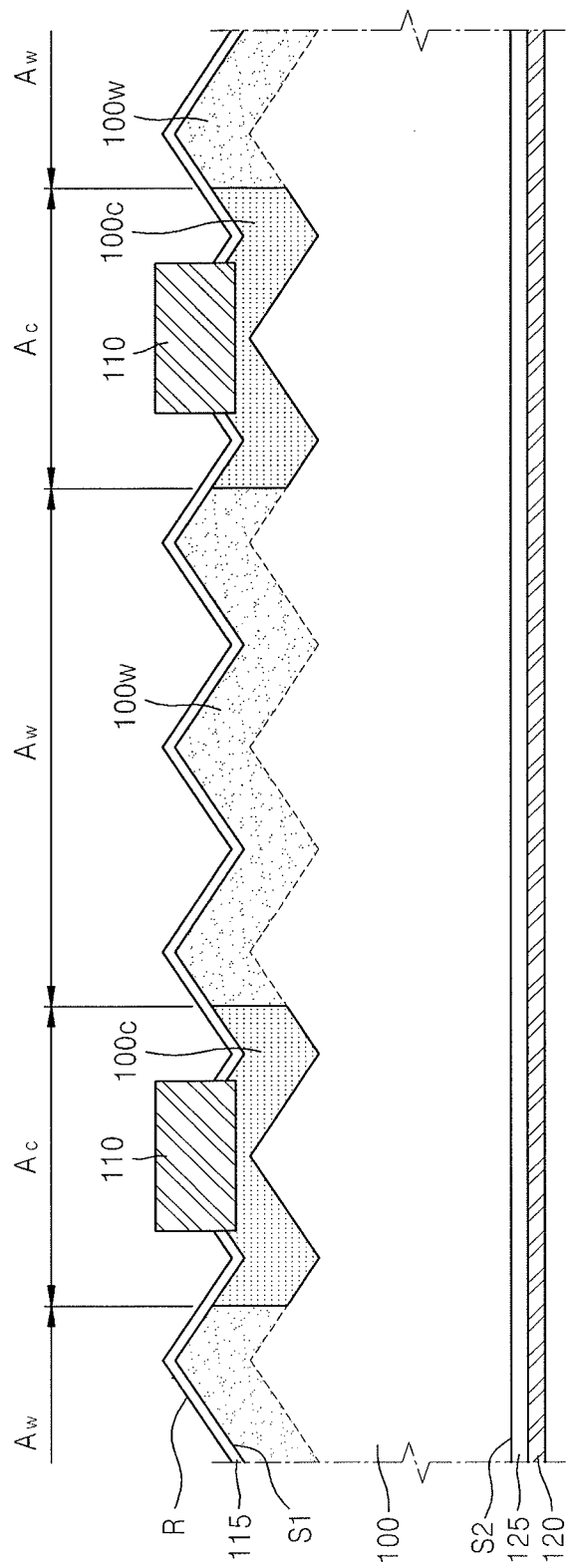

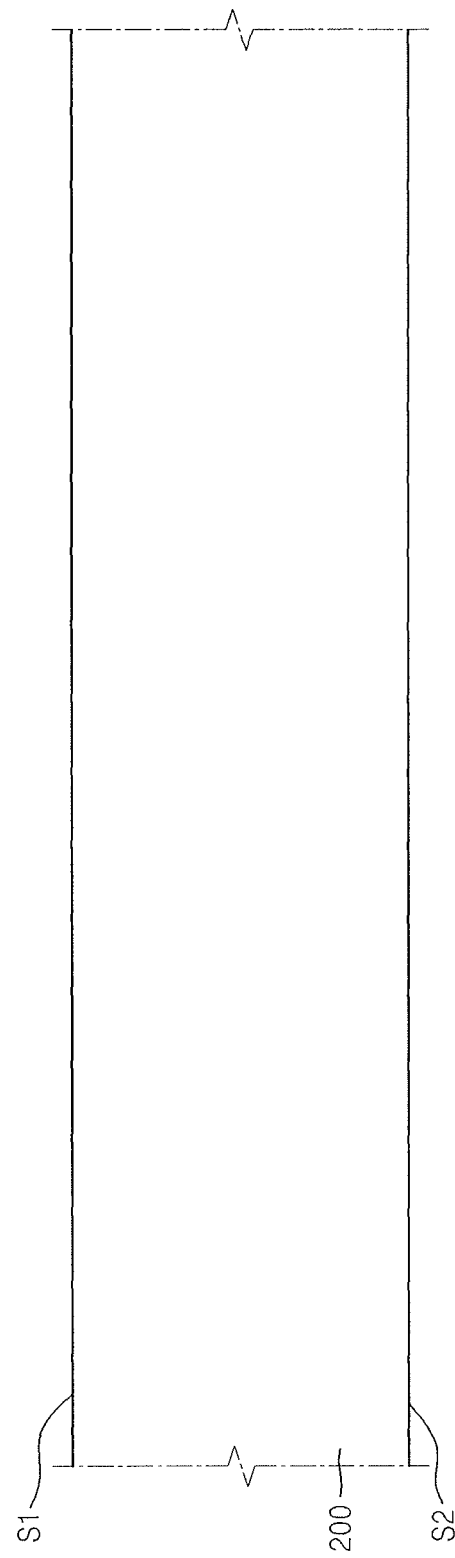

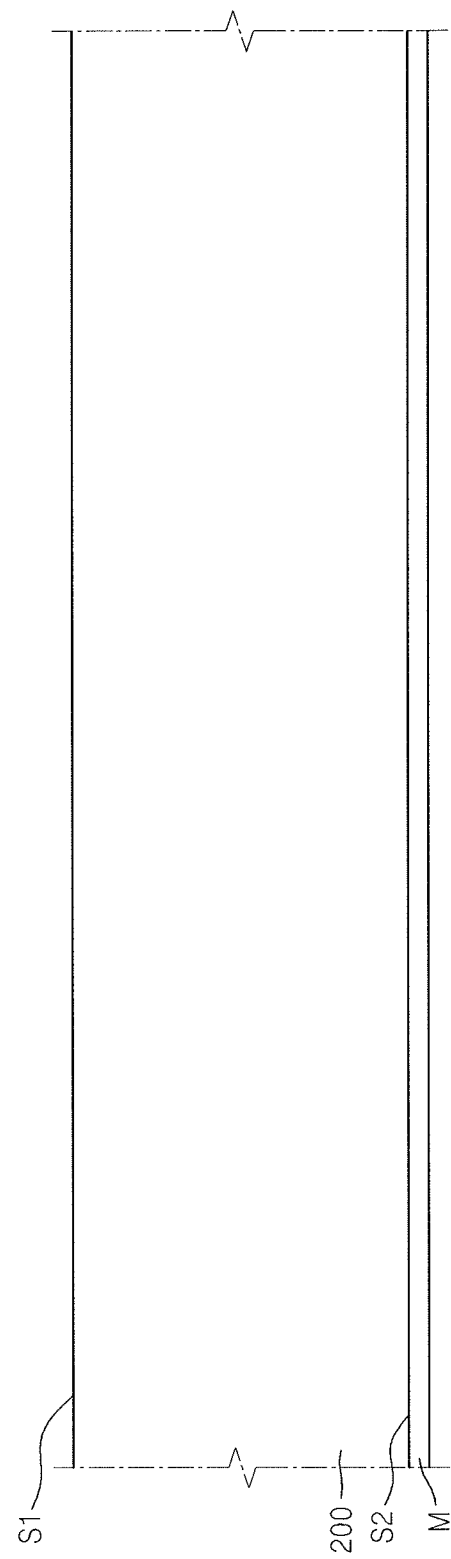

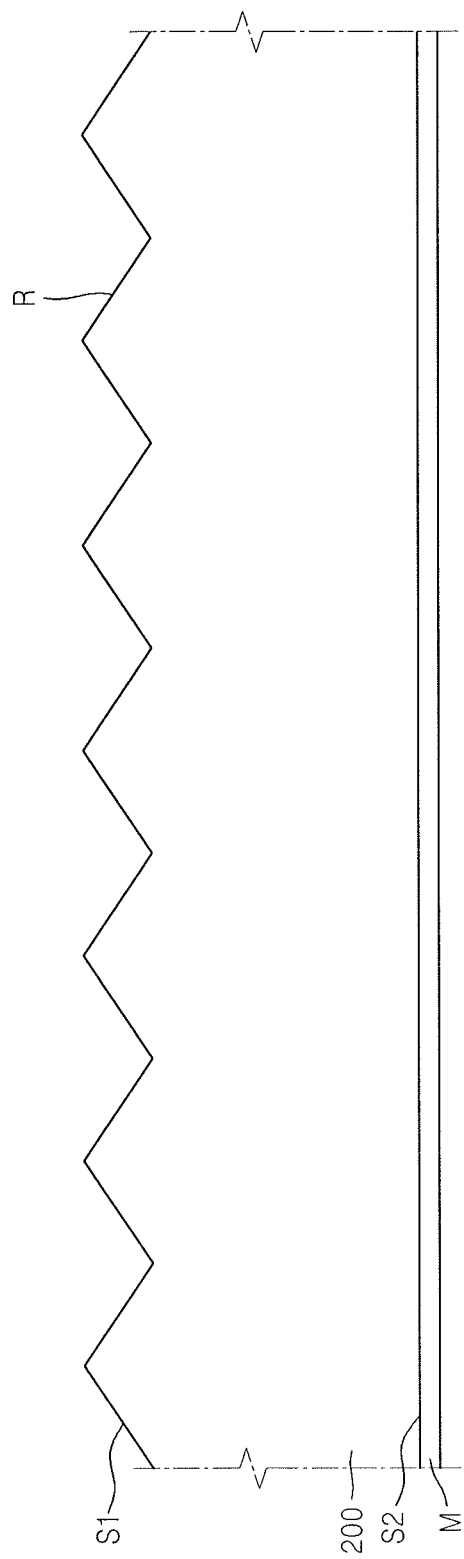

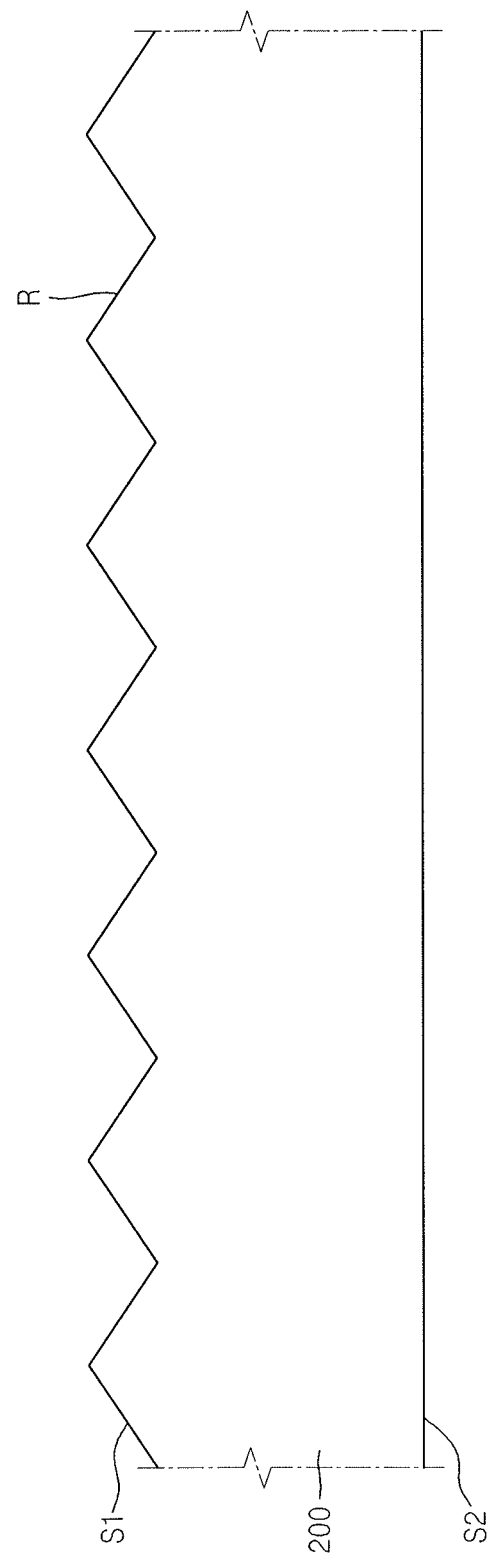

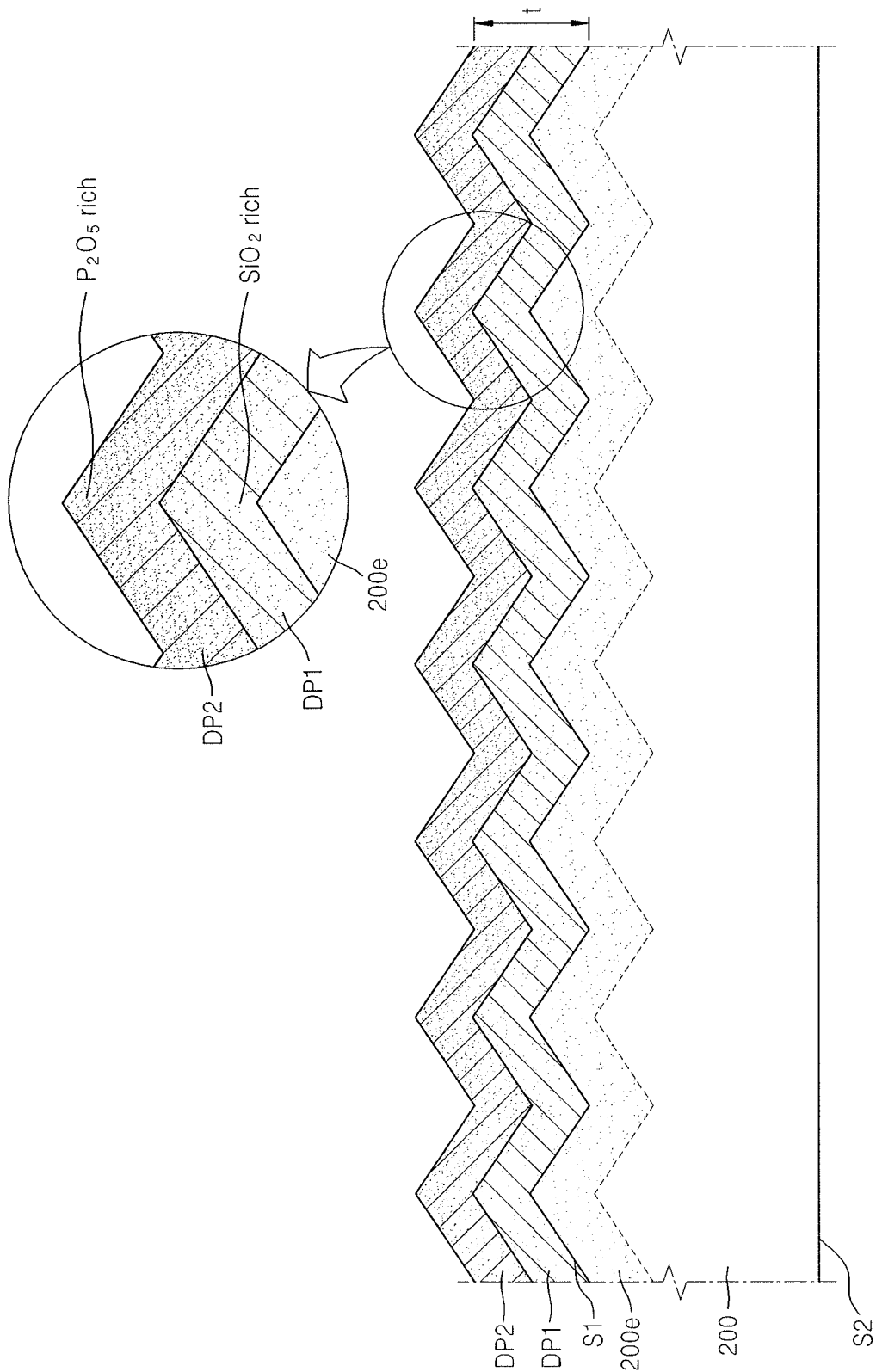

METHOD OF MANUFACTURING PHOTOELECTRIC DEVICE

CROSS-REFERENCE TO RELATED APPLICATION

The present application claims priority under 35 U.S.C. §119(e) to U.S. Provisional Application No. 61/546,642, filed on Oct. 13, 2011, and entitled: "Method of Manufacturing for Photoelectric Device," which is incorporated herein by reference in its entirety.

BACKGROUND

1. Field

Embodiments relate to a method of manufacturing a photoelectric device.

2. Description of the Related Art

Due to, e.g., exhaustion of energy resources and environmental pollution of the earth, development of clean energy sources has been considered. As a clean energy, photovoltaic energy (generated using solar cells) may be directly transformed from sunlight and thus has been regarded as a renewable energy source.

SUMMARY

Embodiments are directed to a method of manufacturing a photoelectric device.

The embodiments may be realized by providing a method of manufacturing a solar cell, the method including providing a semiconductor substrate having a first conductivity type; performing a first deposition process, the first deposition process including forming a first doping material layer having a second conductivity type different from the first conductivity type; performing a drive-in process, the drive-in process including heating the substrate having the first doping material layer thereon; performing a second deposition process after performing the drive-in process, the second deposition process including forming a second doping material layer on the first doping material layer, wherein the second doping material layer has the second conductivity type; locally heating portions of the substrate, the first doping material layer, and the second doping material layer with a laser to form a contact layer at a first surface of the substrate; and forming a first electrode on the contact layer and a second electrode on a second surface of the substrate opposite to the first surface.

The first deposition process may include providing the substrate in a deposition chamber, and providing a first doping source to the deposition chamber, and the second deposition process may include providing the substrate in the deposition chamber, and providing a second doping source to the deposition chamber.

The first doping source may include $POCl_3$.

Providing the first doping source may include carrying the first doping source in a carrier such that the first doping source is included at a concentration of about 5 to about 7%.

Providing the first doping source to the deposition chamber may be performed for about 10 to about 20 minutes.

The second doping source may include $POCl_3$.

Providing the second doping source may include carrying the second doping source in a carrier such that the second doping source is included at a concentration of about 10% or greater.

Providing the second doping source to the deposition chamber may be performed for about 3 to about 8 minutes.

Providing the first doping source may be performed for a first time period, providing the second doping source may be performed for a second time period, and the first time period may be longer than the second time period.

Providing the first doping source may include carrying the first doping source in one carrier such that the first doping source is included at a first concentration, providing the second doping source may include carrying the second doping source in another carrier such that the second doping source is included at a second concentration, and the second concentration may be greater than the first concentration.

The drive-in process may be performed at about 800° C. to about 900° C. for about 30 to about 50 minutes under an inert atmosphere.

The drive-in process may include forming an emitter layer at the first surface of the substrate.

Locally heating portions of the substrate, the first doping material layer, and the second doping material layer may further include forming a window layer adjacent to the contact layer at the first surface of the substrate such that the window layer has a lower doping concentration than a doping concentration of the contact layer.

The method may further include removing the first doping material layer and the second doping material layer after locally heating portions of the substrate, the first doping material layer, and the second doping material layer.

Removing the first doping material layer and the second doping material layer may include etching with an acidic solution.

The method may further include forming an antireflective layer on the substrate after locally heating portions of the substrate, the first doping material layer, and the second doping material layer.

The method may further include forming a back surface field layer on the second surface of the substrate such that the back surface field layer has the first conductivity type.

The embodiments may also be realized by providing a method of manufacturing a solar cell, the method including providing a semiconductor substrate, the semiconductor substrate having a first conductivity type; performing a first deposition process, the first deposition process including forming a first doping material layer having a second conductivity type different from the first conductivity type; rapidly diffusing a dopant of the first doping material layer into the substrate to form an emitter layer at a first surface of the substrate; performing a second deposition process after rapidly diffusing the dopant, the second deposition process including forming a second doping material layer thereon, wherein the second doping material layer has the second conductivity type, and the first doping material layer together with the second doping material layer have a variable concentration gradient such that a concentration of silicon oxide in the first and second doping material layers is greater in proportion to a proximity with the substrate; selectively diffusing the dopant of the first and second doping material layers into the emitter layer to form a contact layer at portions of the first surface of the substrate; and forming a first electrode on the contact layer and a second electrode on a second surface of the substrate opposite to the first surface.

BRIEF DESCRIPTION OF THE DRAWINGS

The embodiments will become apparent to those of ordinary skill in the art by describing in detail exemplary embodiments with reference to the attached drawings in which:

FIGS. 1 and 2 illustrate schematic views showing a structure of a photoelectric device according to an embodiment; and FIGS. 3A through 3M illustrate cross-sectional views showing stages in a method of manufacturing a photoelectric device according to an embodiment.

DETAILED DESCRIPTION

Figure 1:
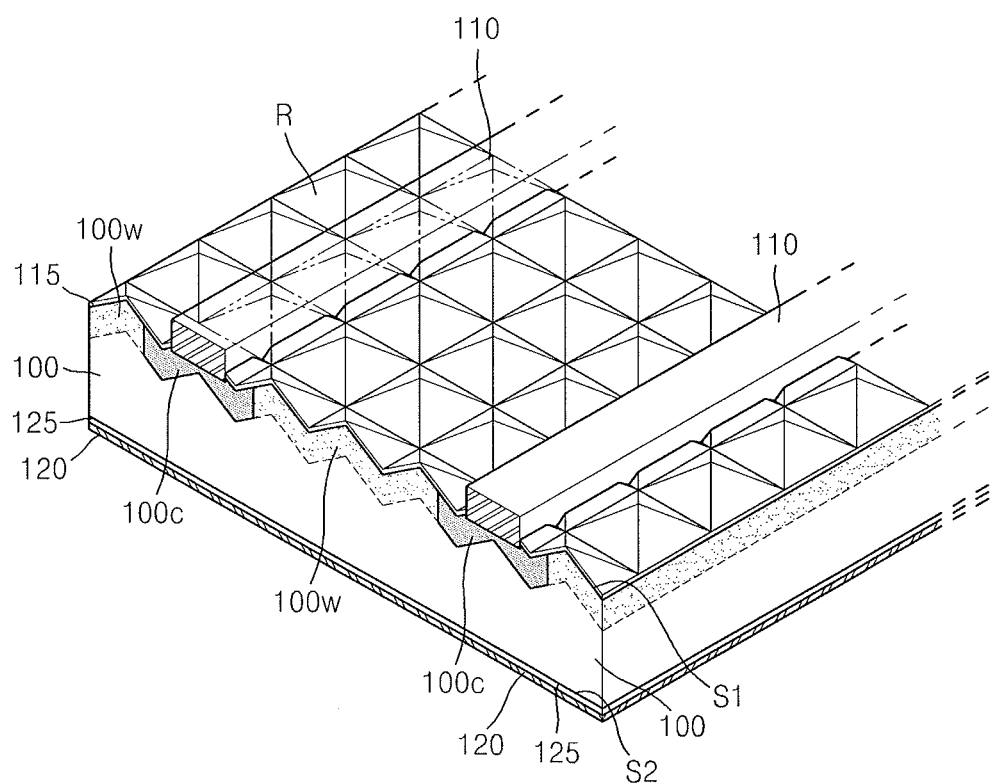

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

FIGS. 1 and 2 illustrate schematic views showing a structure of a photoelectric device according to an embodiment.

Referring to FIGS. 1 and 2, the photoelectric device may include a semiconductor substrate 100, contact layers 100c and window layers 100w alternately formed on the semiconductor substrate 100, and first electrodes 110 on the contact layers 100c.

The semiconductor substrate 100 may have a first surface S1 and a second surface S2 opposite to the first surface S1. For example, the first surface S1 may be a light-receiving surface of the semiconductor substrate 100, and the second surface S2 may be a reverse surface opposite to the light-receiving surface.

The semiconductor substrate 100 may generate carriers when light is received on the first surface S1. The carriers refer to holes and electrons generated when light is absorbed into the semiconductor substrate 100. The semiconductor substrate 100 may be formed as, e.g., a single crystal or polycrystalline silicon substrate having an n or p conductivity type. For example, the semiconductor substrate 100 may be a p-type single crystal silicon substrate.

Microroughness may be formed on the first surface S1 of the semiconductor substrate 100. For example, a texture structure R including a roughness pattern may be formed on the first surface S1 of the semiconductor substrate 100. The texture structure R may reduce reflectance of incident light, and may increase a light harvesting efficiency to facilitate absorption of the incident light into the semiconductor substrate 100 as much as possible.

The contact layers 100c and the window layers 100w may be formed at the first surface S1 of the semiconductor substrate 100. For example, the contact layers 100c and the window layers 100w may be alternately formed along the first surface S1 of the semiconductor substrate 100. In FIG. 2, Ac and Aw respectively represent areas where the contact layers 100c and the window layers 100w are formed.

The contact layers 100c and the window layers 100w may be doped with a material having a conductivity type inverse or opposite to that of the semiconductor substrate 100, and thus may form p-n junction. For example, the contact layers 100c and the window layers 100w may be formed as a doping layer of which a conductivity type is inversed by injecting an n-type dopant into the p-type semiconductor substrate 100. The contact layers 100c and the window layers 100w may have the same conductivity type, but different doping levels. For example, the contact layers 100c may be doped at a high concentration, and the window layers 100w may be doped at a low concentration.

The contact layers 100c may be areas where electrode junction parts (on which the first electrodes 110 are to be disposed) are selectively doped at a high concentration, and may form a selective emitter on which emitters for collecting minority carriers generated by the semiconductor substrate 100 are locally formed. For example, the first electrodes 110 may be formed on the contact layers 100c by using a metallic material, and a contact resistance with the first electrodes 110 may be reduced by doping the electrode junction parts at a high concentration.

The window layers 100w may provide a suitable incident surface of the semiconductor substrate 100. When light is incident on the window layers 100w, the semiconductor substrate 100 may generate carriers. The contact resistance with the first electrodes 110 may be reduced by doping the contact layers 100c (on which the first electrodes 110 are disposed) at a high concentration. Thus, a surface recombination loss caused by an excessive dopant concentrated on a surface of the semiconductor substrate 100 may be reduced, and a transformation efficiency with respect to short wavelengths absorbed near the surface may be increased by doping the window layers 100w (on which the first electrodes 110 are not disposed) at a low concentration.

The contact layers 100c and the window layers 100w may be formed by locally heating the semiconductor substrate 100 on which a doping material layer (not shown) is fully coated, and thereby increasing a solid solubility and a diffusion speed of a dopant in the locally heated areas. In this case, the locally heated areas may form the contact layers 100c (doped at a high concentration), and remaining, non-locally heated areas may form the window layers 100w (doped at a low concentration).

For example, the contact layers 100c and the window layers 100w may be formed by performing a series of processes, e.g., a first deposition, drive-in, a second deposition, and local heating. A thick doping material layer (not shown) may be formed on the semiconductor substrate 100 by performing two deposition processes, i.e., the first deposition and the second deposition processes.

In the drive-in process, thermal processing may be performed at a high temperature to diffuse a dopant of the doping material layer into the semiconductor substrate 100. In the local heating process, the contact layers 100c and the window layers 100w (having different doping levels) may be formed by locally heating some selected areas of the semiconductor substrate 100.

As described above, two deposition processes, i.e., the first deposition and the second deposition processes, may be performed. Thus, a thick doping material layer (not shown) may be formed on the semiconductor substrate 100, and a doping level of the contact layers 100c may be increased to obtain a high open-circuit voltage. Also, a contact resistance between the contact layers 100c and the first electrodes 110 may be advantageously reduced.

For example, the two deposition processes, i.e., the first deposition and the second deposition processes, may be performed under different process conditions before and after the drive-in process. Thus, a doping level may be increased, while a recombination loss or a carrier lifetime reduction caused by an increase in a doping level may be avoided. For example, a higher concentration and a shorter process time may be applied to the second deposition process than to the first deposition process. Thus, a concentration gradient (that facilitates diffusion of a dopant) may be formed, a low or small junction depth of p-n junction for charge-separating carriers generated by light may be maintained (even when a doping level of the contact layers 100c is increased), and a dopant may be prevented from being excessively concentrated on a surface of the semiconductor substrate 100.

The above effects will now be described in detail in comparison to Comparative Examples 1 and 2.

In Comparative Example 1, a thick doping material layer was formed by performing a single deposition process to obtain a high doping concentration. In Comparative Example 1, a surface concentration of the semiconductor substrate 100 was excessively increased and thus, a surface recombination speed was increased and a lifetime of carriers was reduced. Also, in Comparative Example 1, a junction depth of a p-n junction for charge-separating carriers generated by light was increased and thus carrier collection efficiency was reduced. Consequently, an open-circuit voltage and a short-circuit current were reduced, and a fill factor and a transformation efficiency were reduced.

In Comparative Example 2, instead of forming a thick doping material layer, a high-power laser was irradiated onto the contact layers so as to increase a solid solubility of a dopant, and to promote diffusion of the dopant into the irradiated areas. For example, in Comparative Example 2, because the solid solubility of the dopant was further increased and the diffusion of the dopant was promoted by irradiating a high-power laser onto selected areas of the semiconductor substrate on which the doping material layer was formed (i.e., the contact layers), the contact layers were formed at a high concentration even without forming a thick doping material layer. However, in Comparative Example 2, since the high-power laser damaged a surface of the semiconductor substrate, a resistance of irradiated areas was increased and a surface recombination loss increase, thus a fill factor was reduced.

According to an embodiment, a higher concentration and a shorter process time may be applied to the second deposition process than to the first deposition process. Thus, a doping concentration of a selective emitter (the contact layers 100c) may be increased, and a junction depth and a surface recombination speed may be reduced.

In the local heating process after the first deposition and second deposition processes, selected areas (the contact layers 100c) on the semiconductor substrate 100 (that are doped at a uniform concentration) may be locally heated. Thus, the window layers 100w and the contact layers 100c (having different doping levels) may be formed. For example, a solid solubility and a diffusion speed may be increased in laser irradiated areas and a dopant of a doping material layer (not shown) may be rapidly diffused into the laser irradiated areas, thereby increasing a doping level. The laser irradiated areas may form the contact layers 100c (doped at a high concentration), and non-laser irradiated areas may form the window layers 100w (doped at a low concentration).

An output of the laser may be set within a range suitable for sufficiently promoting diffusion of a dopant into irradiated areas without causing damage due to irradiation of the laser. Maintaining the output of the laser within a suitable range may help prevent damage to the irradiated areas, thereby helping to prevent an increase in resistance as well helping to prevent a reduction in a fill factor.

The first electrodes 110 may be formed on the contact layers 100c. The first electrodes 110 may externally output charge-separated carriers by using p-n junction. The first electrodes 110 may contact the contact layers 100c (which may be selectively doped at a high concentration).

The first electrodes 110 may be formed in a pattern of stripes extending in one direction along a direction of outputting photocurrents. The first electrodes 110 may be formed of or include a metallic material, e.g., silver (Ag), aluminum (Al), copper (Cu), or nickel (Ni). The first electrodes 110 may be screen-printed on the contact layers 100c by, e.g., coating, drying, and firing an electrode paste. The first electrodes 110 may contact the contact layers 100c doped at a high concentration. Thus, a contact resistance between the contact layers 100c and the first electrodes 110 may be reduced.

Second electrodes 120 may be formed on the second surface S2 of the semiconductor substrate 100. For example, the second electrodes 120 may be screen-printed on the semiconductor substrate 100, and may contact a base for collecting a plurality of carriers.

An antireflective layer 115 and a back surface field (BSF) layer 125 may be respectively formed on the first and second surfaces S1 and S2 of the semiconductor substrate 100. For example, the antireflective layer 115 may help reduce reflectance of incident light by using destructive interference, and may help increase selectivity of certain wavelength areas.

The antireflective layer 115 may be formed as a monolayer of, e.g., a silicon oxide ($SiO_2$) layer, a silicon nitride ($Si_3N_4$) layer, a hydrogenated silicon nitride (SiN:H) layer, or a multilayer thereof. The antireflective layer 115 may be formed by, e.g., a thermal oxidation method or a chemical vapor deposition (CVD) method.

The BSF layer 125 may be formed as a highly-doped layer having the same conductivity type as that of the semiconductor substrate 100. The BSF layer 125 may form a BSF by using a high concentration/low concentration junction in order to suppress surface recombination of carriers. For example, the BSF layer 125 may be formed as a highly-doped p+ layer on the p-type semiconductor substrate 100.

The antireflective layer 115 and the BSF layer 125 may have a passivation function for reducing a surface recombination loss. For example, the antireflective layer 115 and the BSF layer 125 may function as passivation layers of the first and second surfaces S1 and S2 of the semiconductor substrate 100.

A method of manufacturing a photoelectric device according to an embodiment will now be described with reference to FIGS. 3A through 3M.

First, as illustrated in FIG. 3A, a semiconductor substrate 200 may be prepared. For example, the semiconductor substrate 200 may be prepared as a p-type crystalline silicon wafer. A cleaning process may be performed by using an acidic or alkaline solution to remove physical or chemical impurities from a surface of the semiconductor substrate 200.

Then, as illustrated in FIG. 3B, a mask layer M may be on the second surface S2 of the semiconductor substrate 200. As will be described below, the mask layer M may function as an etching mask when surface texturing is performed on the first surface S1 of the semiconductor substrate 200. The mask layer M may be formed of a material that is resistant to a texturing etchant. For example, the mask layer M may include a silicon oxide ($SiO_2$) layer or a silicon nitride ($Si_3N_4$) layer. The mask layer M may be formed by growing an oxide layer based on a thermal oxidation method, or by depositing an oxide layer or a nitride layer based on a CVD method.

Then, as illustrated in FIG. 3C, surface texturing may be performed on the first surface S1 of the semiconductor substrate 200. For example, anisotropic etching may be performed on the semiconductor substrate 200 by using an alkaline solution, e.g., KOH or NaOH, as an etchant, and a texture structure R having a roughness pattern may be formed on the first surface S1 of the semiconductor substrate 200. In this case, the second surface S2 of the semiconductor substrate 200 (which is covered by the mask layer M) may be protected from being etched. As illustrated in FIG. 3D, the mask layer M (which is no longer necessary) may be removed.

Figure 3E:
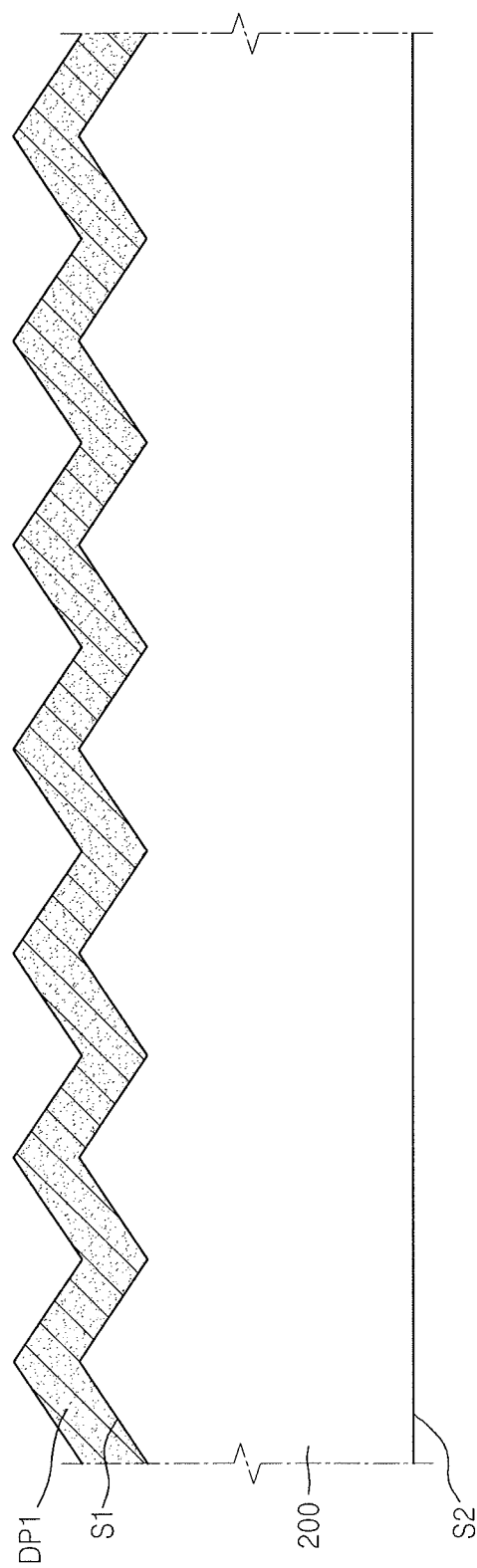
Figure 3F:
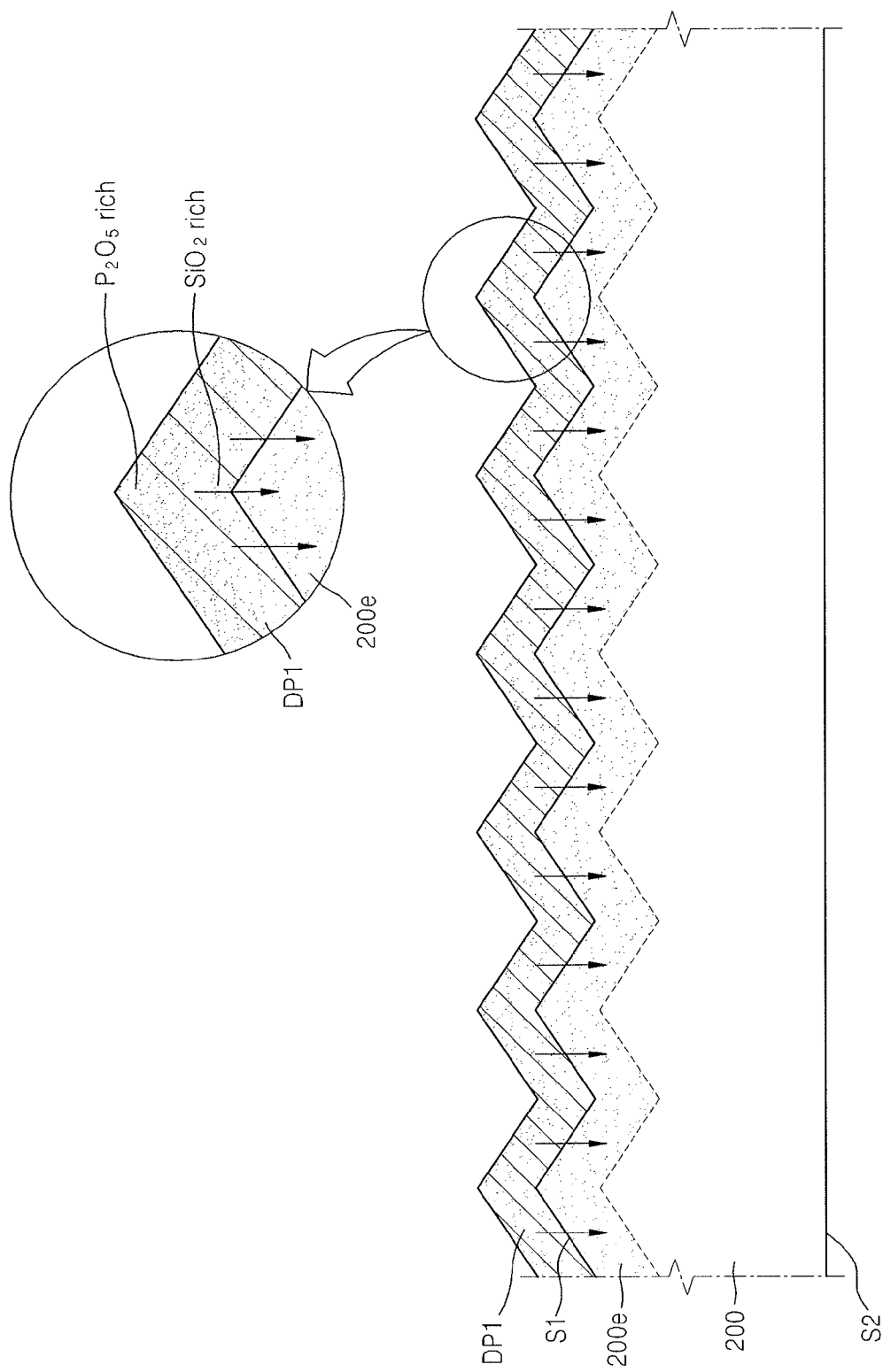
Figure 3H:
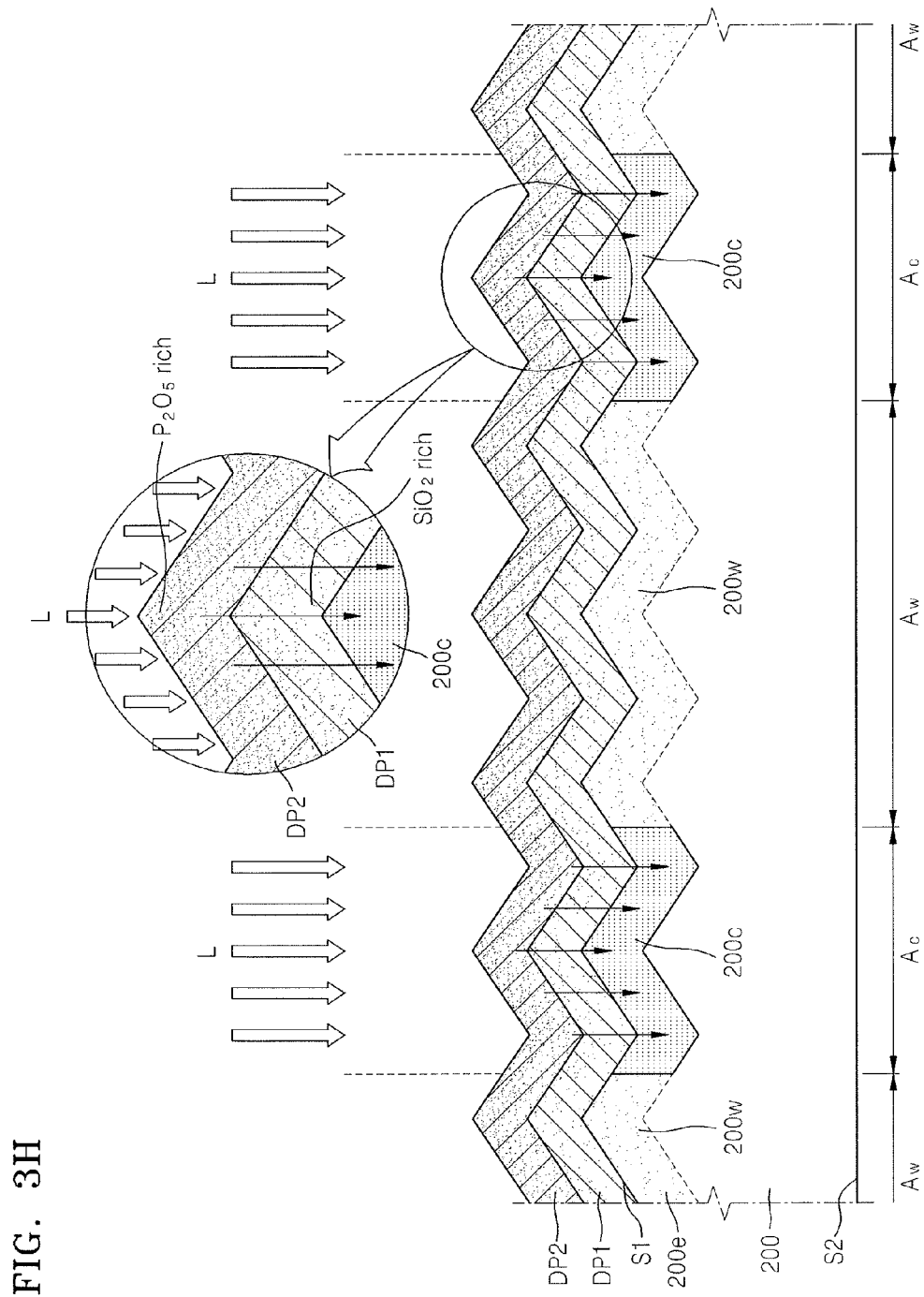
Figure 3I:
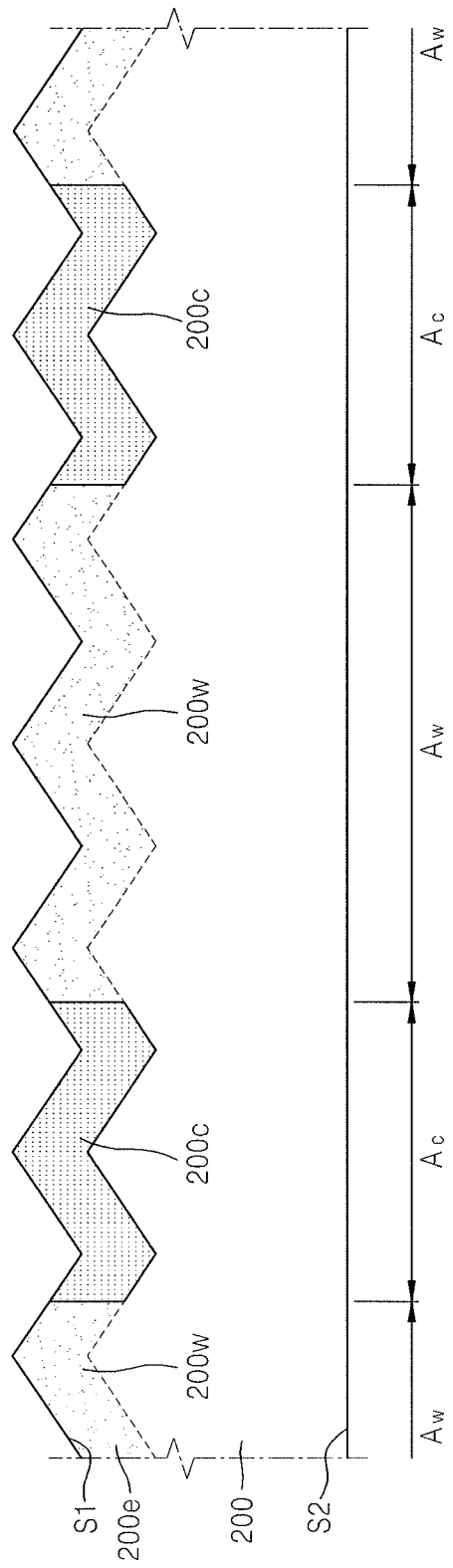

Then, a series of processes, illustrated in FIGS. 3E through 3I, may be performed. As illustrated in FIG. 3I, contact layers 200c and window layers 200w may be formed at the first surface S1 of the semiconductor substrate 200. The contact layers 200c and the window layers 200w may be formed by performing a series of processes, e.g., a first deposition, a drive-in, a second deposition, and a local heating. These processes will now be described in detail.

Initially, as illustrated in FIG. 3E, the first deposition process may be performed to form a first doping material layer DP1 on the first surface S1 of the semiconductor substrate 200. In the first deposition process, the first doping material layer DP1 may be formed as a p-type or n-type layer. For example, an n-type first doping material layer DP1 (having a conductivity type inverse or opposite to that of a p-type semiconductor substrate 200) may be formed. In the first deposition process, a diffusion or deposition system using a diffusion tube or a deposition chamber may be applied.

For example, in the first deposition process, as a doping source, phosphorus oxychloride ($POCl_3$) may be applied onto the semiconductor substrate 200 in the deposition chamber by using a carrier, e.g., a carrier gas, in which nitrogen and oxygen are mixed. In this case, $POCl_3$ may react with oxygen and may form the first doping material layer DP1 in the form of a $P_2O_5$ oxide layer.

Before reacting with silicon of the semiconductor substrate 200, the first doping material layer DP1 may be in the form of a $P_2O_5$ oxide layer. Due to reaction with silicon, a dopant (phosphorus) of the first doping material layer DP1 may be diffused into the semiconductor substrate 200, and an oxide may grow at the first surface S1 of the semiconductor substrate 200. In this case, the first doping material layer DP1 may be in the form of a glass layer including $SiO_2$, e.g., a phosphosilicate glass (PSG) layer.

For example, in the first deposition process, a concentration of $POCl_3$ may be about 5% to about 7%. Maintaining the concentration of the doping source at about 5% or greater may help ensure a sufficient surface concentration of the semiconductor substrate 200, thereby preventing an increase in a contact resistance with electrodes. Maintaining the concentration of the doping source at about 7% or less may help prevent an excessive increase in the surface concentration of the semiconductor substrate 200, thereby preventing an increase in a surface recombination loss. For example, the first deposition process may be performed at about 800° C. to about 900° C. for about 10 to about 20 minutes. In an implementation, the first deposition process may be performed at about 840° C. for about 15 minutes by using $POCl_3$ having a concentration of about 5.7% as the doping source.

For reference, in this specification, the concentration of $POCl_3$ refers to a volume flow rate of $POCl_3$ in a carrier or carrier gas injected into the deposition chamber in which the semiconductor substrate 200 is disposed. For example, $POCl_3$ having a concentration of 5.7% represents that a volume flow rate of $POCl_3$ in a total of 17.5 standard liters per minute (slm) (0° C. and 1atm) of a carrier gas including 16 slm of nitrogen, 0.5 slm of oxygen, and 1 slm of $POCl_3$, is 5.7%.

Then, as illustrated in FIG. 3F, the drive-in process may be performed to facilitate rapid diffusion of the dopant of the first doping material layer DP1 into the semiconductor substrate 200. In the drive-in process, the semiconductor substrate 200 in the deposition chamber may be maintained at a high temperature without additionally injecting a doping material. The first deposition and drive-in processes may be sequentially performed in the deposition chamber. The drive-in process may be performed at about 800° C. to about 900° C., e.g., about 840° C., for about 30 to about 50 minutes, e.g., about 40 minutes, under an inert atmosphere, e.g., a nitrogen atmosphere.

For example, if the dopant (phosphorus) of the first doping material layer DP1 is diffused into the semiconductor substrate 200, an n-type emitter layer 200e may be formed at the first surface S1 of the semiconductor substrate 200. In this case, if the dopant (phosphorus, e.g., $P_2O_5$) is diffused into the semiconductor substrate 200, an oxide may grow at the first surface S1 of the semiconductor substrate 200, and the first doping material layer DP1 may have a continuously variable concentration gradient between an upper portion (having a relatively high content of $P_2O_5$) and a lower portion (having a relatively high content of $SiO_2$) along a thickness direction. For example, a concentration of silicon oxide in the first doping material layer DP1 may be greater in proportion to a proximity with the substrate 200.

Then, as illustrated in FIG. 3G, the second deposition process may be performed to form a second doping material layer DP2 on the first doping material layer DP1. In the second deposition process, the second doping material layer DP2 may have the same conductivity type as that of the first doping material layer DP1, and a diffusion or deposition system using a diffusion tube or deposition chamber may be applied.

For example, in the second deposition process, as a doping source, $POCl_3$ may be applied onto the semiconductor substrate 200 in the deposition chamber by using a carrier, e.g., a carrier gas, in which nitrogen and oxygen are mixed.

The second deposition process may be performed under a different process condition from that of the first deposition process. For example, a higher concentration of the doping source and/or a shorter process time may be applied to the second deposition process relative to the first deposition process. As described above, a higher concentration may be applied to the second deposition process relative to the first deposition process. Thus, a concentration gradient that facilitates diffusion of a dopant from the second doping material layer DP2 into the semiconductor substrate 200 may be formed. Also, as described above, a shorter process time may be applied to the second deposition process relative to the first deposition process. Thus, increases in a surface concentration and a junction depth of the semiconductor substrate 200 may be suppressed.

For example, when a first concentration Co1 of the doping source and a first process time t1 in the first deposition process are compared to a second concentration Co2 of the doping source and a second process time t2 in the second deposition process, the second concentration Co2 may be greater than the first concentration Co1 (Co1<Co2), and the second process time t2 may be less than the first process time t1 (t1>t2).

For example, a concentration of $POCl_3$ in the second deposition process may be greater than about 10%, e.g., greater than about 12%. Maintaining the concentration of the doping source at greater than about 10% may help ensure that a higher concentration gradient than that of the first deposition process, i.e., a concentration gradient that facilitates diffusing the dopant, is formed. The second deposition process may be performed at about 800° C. to about 900° C. for about 3 to about 8 minutes. In an implementation, the second deposition process may be performed at about 840° C. for about 5 minutes by using a POCl$_3$ solution having a concentration of about 12.5% as the doping source.

For example, before the dopant is diffused, the second doping material layer DP2 may be in the form of a P$_2$O$_5$ oxide layer. As the dopant of the second doping material layer DP2 is diffused into the semiconductor substrate 200, an oxide may grow at the first surface S1 of the semiconductor substrate 200. In this case, the second doping material layer DP2 may be in the form of a glass layer including SiO$_2$, e.g., a PSG layer.

The second doping material layer DP2 may form a thick PSG layer together with the first doping material layer DP1 (formed in the first deposition process). For example, the second doping material layer DP2 may form a single PSG layer (having a predetermined thickness t) together with the first doping material layer DP1. In this case, the PSG layer may have a concentration profile having a relatively high content of SiO$_2$ near an interface of the semiconductor substrate 200 while having a relatively low content of SiO$_2$ and a relatively high content of P$_2$O$_5$ away from the interface. For example, the first doping material layer DP1 together with the second doping material layer DP2 may have a, e.g., continuously, variable concentration gradient such that a concentration of silicon oxide in the first and second doping material layer DP1, DP2 is greater in proportion to a proximity with the substrate 200.

Then, as illustrated in FIG. 3H, the local heating process may be performed to locally heat contact areas Ac on the semiconductor substrate 200 (on which the first and second doping material layers DP1 and DP2 are formed), thereby varying doping levels. In the local heating process, the contact layers 200c may be formed at a high concentration by locally heating some areas on the semiconductor substrate 200, e.g., the contact areas Ac where the first electrodes 210 will be formed.

If a laser L is irradiated onto the contact areas Ac on the semiconductor substrate 200, a solid solubility and a diffusion speed of the contact areas Ac may be increased. For example, the dopant (phosphorus) of the first and second doping material layers DP1 and DP2 (formed to be thick in the pre-deposition and post-deposition processes) may be diffused into the contact areas Ac onto which the laser L is irradiated, and a doping concentration may be increased.

In this case, the contact layers 200c (having a high doping level) may be formed in the contact areas Ac (onto which the laser L has been irradiated), and the window layers 200w (having a low doping level) may be formed in window areas Aw (onto which the laser L has not been irradiated). The irradiated laser L may be transmitted without being absorbed into the first and second doping material layers DP1 and DP2 having a high band-gap energy, and may be absorbed into the semiconductor substrate 200 to increase a solid solubility and a diffusion speed of the dopant (phosphorus).

According to an embodiment, two deposition processes, i.e., the first deposition and the second deposition processes, may be performed. Thus, when compared to a case when deposition is performed once, the first and second doping material layers DP1 and DP2 may be formed to be thick, and the contact layers 200c may be formed at a high concentration by performing the local heating process. A doping concentration of the contact layers 200c may be increased. Thus, a contact resistance with the first electrodes 110 may be reduced, a serial resistance of photocurrents may be reduced, a high open-circuit voltage may be obtained, and a fill factor may be increased.

Then, as illustrated in FIGS. 3H and 3I, an etch-back process may be performed to remove the first and second doping material layers DP1 and DP2. The first and second doping material layers DP1 and DP2 may be in the form of a PSG layer. The first and second doping material layers DP1 and DP2 may include precipitates of metallic impurities contained in the semiconductor substrate 200. Thus, a gathering effect for removing impurities may be expected by removing the first and second doping material layers DP1 and DP2.

The first and second doping material layers DP1 and DP2 may be etched by using an acidic solution, e.g., a mixed solution of nitric acid (HNO$_3$), hydrofluoric acid (HF), and acetic acid (CH$_3$COOH or deionized (DI) water), as an etchant. However, in another implementation, the first and second doping material layers DP1 and DP2 may not be removed, and may remain to be used as a passivation layer.

Figure 3J:
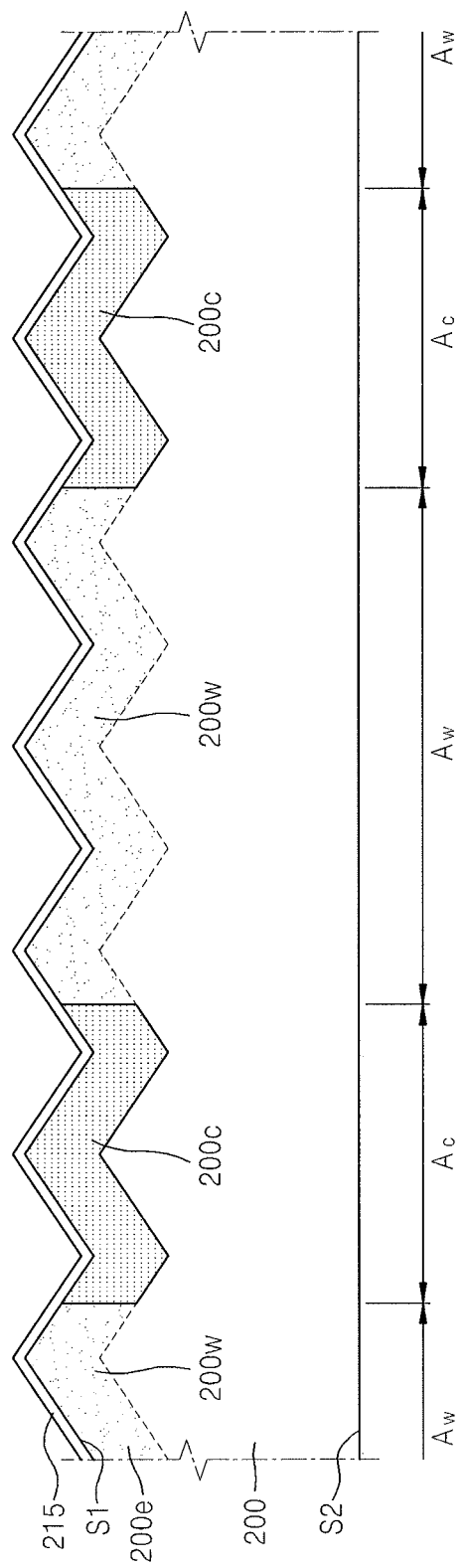

Then, as illustrated in FIG. 3J, an antireflective layer 215 may be formed on the first surface S1 of the semiconductor substrate 200. For example, the antireflective layer 215 may be formed as a silicon oxide (SiO$_2$) layer, a silicon nitride (Si$_3$N$_4$) layer, a hydrogenated silicon nitride (SiN:H) layer, or a multilayer thereof. In an implementation, the antireflective layer 215 may be formed as a monolayer of a silicon oxide layer, or a multilayer of a silicon oxide layer and a silicon nitride layer having different refractive indices. The antireflective layer 215 may be formed by, e.g., a CVD method.

The antireflective layer 215 may have a passivation function that helps prevent surface recombination of carriers generated by the semiconductor substrate 200 and thus may help improve carrier collection efficiency. For example, the antireflective layer 215 may help improve carrier collection efficiency by preventing trapping of carriers due to a dangling bond of silicon atoms on a surface of the semiconductor substrate 200.

Figure 3K:
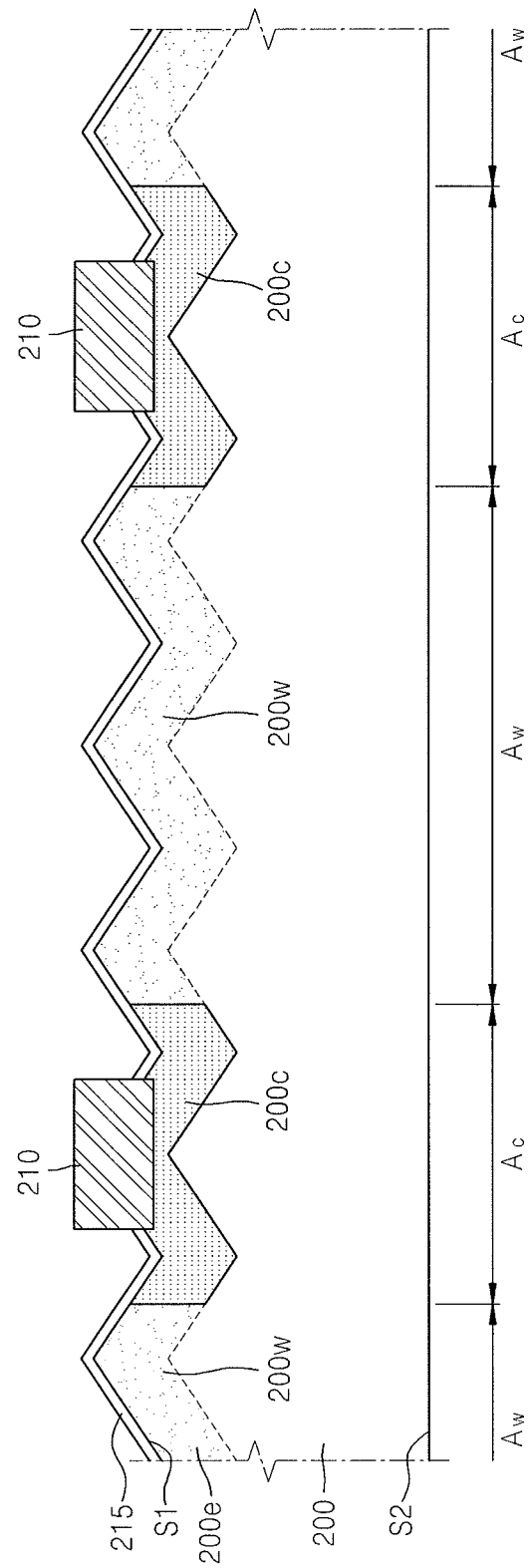

Then, as illustrated in FIG. 3K, the first electrodes 210 may be formed on the contact layers 200c. The first electrodes 210 may be formed in a pattern of stripes extending in one direction in parallel along a direction of outputting photocurrents, and may be patterned in consideration of suitable or desired incident areas of light.

The first electrodes 210 may include a metallic material, e.g., Ag, Al, Cu, or Ni. For example, an electrode paste (not shown) may be pattern-printed on the contact layers 200c by using a screen printing method, and may be dried and fired. Thus, a glass frit component included in the electrode paste may penetrate through the antireflective layer 215 to facilitate contact between the first electrodes 210 and the contact layers 200c.

Figure 3L:
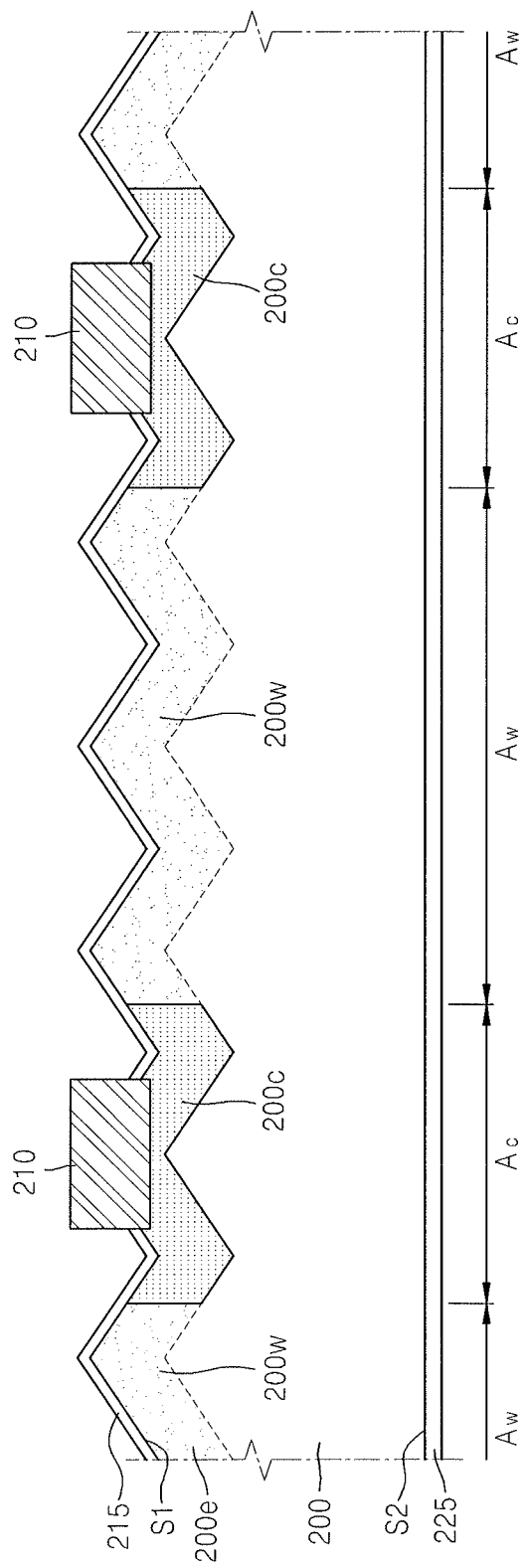

Then, as illustrated in FIG. 3L, a BSF layer 225 may be formed on the second surface S2 of the semiconductor substrate 200. For example, the BSF layer 225 may be formed as a highly-doped layer using a dopant having the same conductivity type as that of the semiconductor substrate 200. For example, the BSF layer 225 may be formed as a highly-doped p+ layer on the second surface S2 of the semiconductor substrate 200, and may help prevent minority carriers (electrons) from moving toward the second surface S2 and being recombined.

Figure 3M:
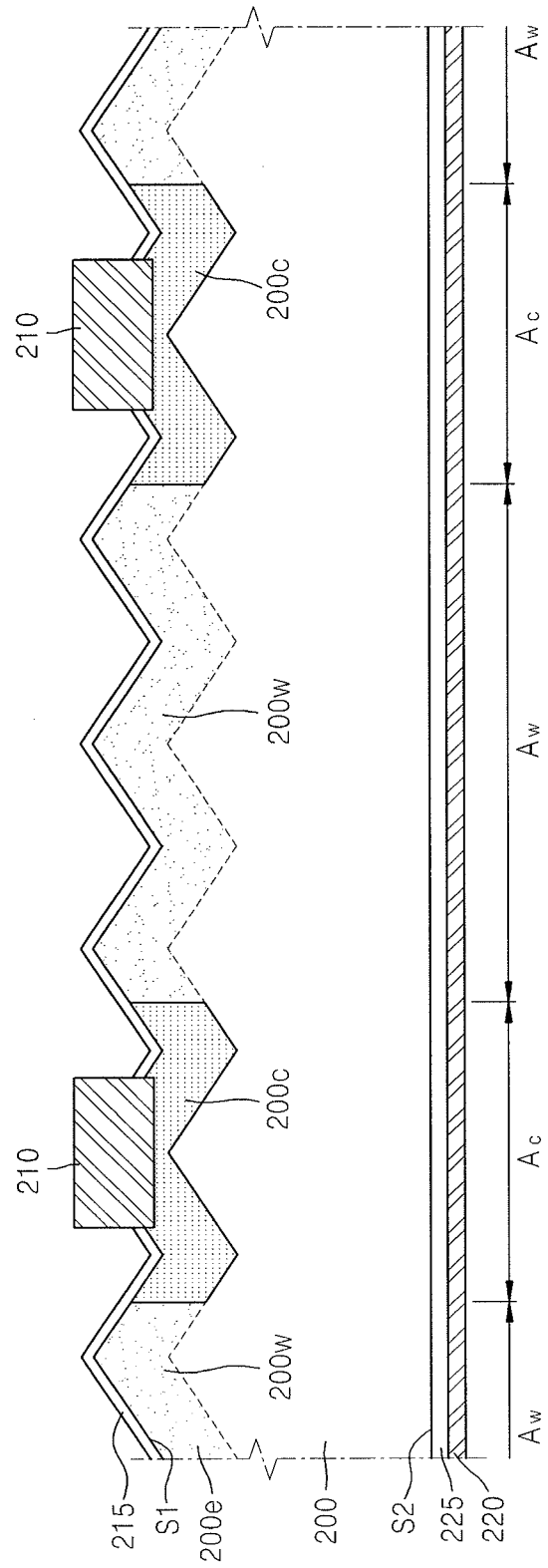

Then, as illustrated in FIG. 3M, second electrodes 220 may be formed on the second surface S2 of the semiconductor substrate 200. The second electrodes 220 may be formed of or include a metallic material, e.g., Ag, Al, Cu, or Ni. The second electrodes 220 may be formed by using a screen printing method or a plating method, and may be formed by, e.g., coating, drying, and firing an electrode paste (not shown). However, in another implementation, the first electrodes 210 on the first surface S1 and the second electrodes 220 on the second surface S2 may be simultaneously formed by co-firing a first electrode paste (not shown) and a second electrode paste (not shown).

Test results regarding characteristics of the photoelectric device according to an embodiment of the present invention are shown in the Table 1, below.

TABLE 1

|  | Case 1 | Case 2 | Case 3 | Case 4 | Example 1 |
|---|---|---|---|---|---|
| Pre-deposition Condition | 840° C., 15 min POCl$_3$ 4.7% | 840° C., 25 min POCl$_3$ 8.7% | 840° C., 15 min POCl$_3$ 8.7% | 840° C., 10 min POCl$_3$ 12.5% | 840° C., 15 min POCl$_3$ 5.7% |
| Drive-in Condition | 840° C., 40 min | 830° C., 20 min | 840° C., 15 min | 840° C., 15 min | 840° C., 40 min |
| Post-deposition Condition | X | X | X | X | 840° C., 5 min, POCl$_3$ 12.5% |
| Thickness (Å) of Doping Material Layer | 245 | 360 | 318 | 270 | 310 |
| Surface Resistance (Ω/□) of Contact Layers | 69 | 50 | 56 | 51 | 49 |
| Surface Resistance (Ω/□) of Window Layers | 110 | 110 | 110 | 110 | 110 |
| Implied open-circuit voltage Voc (mV) | 658 | 648 | 649 | 649 | 660 |

Cases 1 through 4 represent photoelectric devices formed by performing first deposition and drive-in processes, and Example 1 represents a photoelectric device formed by performing two deposition processes, i.e., the first deposition and the second deposition processes, under different process conditions before and after a drive-in process, e.g., according to an embodiment.

In Case 1, the first deposition was performed at 840° C. for 15 minutes by using POCl$_3$ having a concentration of 4.7% as a doping source, and then the drive-in process was performed at 840° C. for 40 minutes.

In Case 2, the first deposition was performed at 840° C. for 25 minutes by using POCl$_3$ having a concentration of 8.7% as a doping source, and then the drive-in process was performed at 830° C. for 20 minutes.

In Case 3, the first deposition was performed at 840° C. for 15 minutes by using POCl$_3$ having a concentration of 8.7% as a doping source, and then the drive-in process was performed at 840° C. for 15 minutes.

In Case 4, the first deposition was performed at 840° C. for 10 minutes by using POCl$_3$ having a concentration of 12.5% as a doping source, and then the drive-in process was performed at 840° C. for 15 minutes.

In Example 1, the first deposition was performed at 840° C. for 15 minutes by using POCl$_3$ having a concentration of 5.7% as a doping source, the drive-in process was performed at 840° C. for 40 minutes, and then the post-deposition was performed at 840° C. for 5 minutes by using POCl$_3$ having a concentration of 12.5% as a doping source.

In each of Cases 1 through 4 and Example 1, a thickness of a doping material layer, a surface resistance of contact layers, and an implied open-circuit voltage Voc were measured. In this case, the surface resistance of the contact layers was measured after making a surface resistance of window layers as 110Ω/□ by performing an etch-back process.

When Example 1 is compared to Case 1, a thicker doping material layer (PSG layer) was formed in Example 1 than in Case 1. If a doping material layer is formed to be relatively thick, the amount of a dopant to be injected or diffused may be increased, and thus a doping level of the contact layers may be increased.

When Example 1 is compared to Cases 2 and 3, a lower surface resistance of the contact layers was obtained in Example 1 than in Cases 2 and 3 (where relatively thicker doping material layers were formed, in comparison to Example 1). Instead of merely thickening a doping material layer, if a concentration gradient that facilitates diffusion of a dopant is formed by applying a doping source having a relatively high concentration to the second deposition relative to the first deposition (as in Example 1), a doping level may be effectively increased and thus the surface resistance of the contact layers may be lowered.

When Example 1 and Case 4 using the same doping source (12.5%, POCl$_3$) are compared, a lower surface resistance of the contact layers was obtained in Example 1 relative to Case 4. Instead of merely increasing a concentration of a doping source, if a concentration gradient that facilitates diffusion of a dopant is formed by applying a doping source having a relatively high concentration to the second deposition (relative to the first deposition, as in Example 1), a doping level may be effectively increased and thus the surface resistance of the contact layers may be lowered.

With regard to the implied open-circuit voltage Vocs in Cases 1 through 4 and Example 1, the highest implied open-circuit voltage Voc was obtained in Example 1. The implied open-circuit voltage Voc reflects a recombination loss of carriers generated by light, and is reduced if the recombination loss is increased. For example, the implied open-circuit voltage Voc is measured by using photo conductance decay (PCD), is calculated by using a measured lifetime of carriers, and is used to predict an open-circuit voltage Voc of a produced photoelectric device. If the lifetime of carriers is long, the implied open-circuit voltage Voc is increased.

The highest implied open-circuit voltage Voc obtained in Example 1 may be a result of suppressing a surface concentration of a semiconductor substrate, reducing a surface recombination loss and a junction depth, and/or improving carrier collection efficiency by a doping source having a relatively low concentration to the first deposition process directly performed on a surface of the semiconductor substrate, and applying a shorter process time to the second deposition process relative to the first deposition.

In Cases 2 through 4 (using higher concentrations of $POCl_3$ in the first deposition process than Case 1), although low surface resistances were obtained in comparison to Case 1 (due to increased in a junction depth and a recombination loss), the implied open-circuit voltages Voc in Cases 2 through 4 were lower than that in Case 1.

As noted above, two deposition processes, i.e., the first deposition and the second deposition processes, may be performed under different process conditions. However, in an implementation, three or more deposition processes may be performed as long as a higher concentration is applied to a subsequent deposition process than to a previous deposition process so as to form a concentration gradient that facilitates diffusion of a dopant, and as a shorter process time is applied to a subsequent deposition process than to a previous deposition process so as to suppress excessive increases in a junction depth and a surface concentration.

For example, if three or more deposition processes are performed, a series of processes such as primary deposition, drive-in, secondary deposition, drive-in, and tertiary deposition may be performed, and a concentration Co1 of a doping source in the primary deposition process, a concentration Co2 of the doping source in the secondary deposition process, and a concentration Co3 of the doping source in the tertiary deposition process may satisfy Co 1<Co2<Co3. Also, a process time t1 in the primary deposition process, a process time t2 in the secondary deposition process, and a process time t3 in the tertiary deposition process may satisfy t1>t2>t3.

By way of summation and review, costs for generating photovoltaic energy (that is currently industrially generated by using solar cells) may be high in comparison to generation by other means. Thus, power generation efficiency of solar cells should be increased to allow broad application of the solar cells. In order to increase power generation efficiency, a surface recombination loss should be reduced, and a serial resistance of photocurrents generated by solar cells should also be reduced.

The embodiments provide a method of manufacturing a photoelectric device that exhibits a reduced contact resistance with electrodes, a reduced serial resistance of photocurrent paths, and a suppressed surface recombination loss caused by excessive increases in a junction depth and a surface concentration.

The embodiments provide a method including doping a selective emitter area for forming electrode junction parts at a high concentration.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a solar cell, the method comprising:
   providing a semiconductor substrate having a first conductivity type;
   performing a first deposition process, the first deposition process including forming a first doping material layer having a second conductivity type different from the first conductivity type;
   performing a drive-in process, the drive-in process including heating the substrate having the first doping material layer thereon;
   performing a second deposition process after performing the drive-in process, the second deposition process including forming a second doping material layer on the first doping material layer, wherein the second doping material layer has the second conductivity type;
   locally heating portions of the substrate, the first doping material layer, and the second doping material layer with a laser to form a contact layer at a first surface of the substrate; and
   forming a first electrode on the contact layer and a second electrode on a second surface of the substrate opposite to the first surface.

2. The method as claimed in claim 1, wherein:
   the first deposition process includes:
      providing the substrate in a deposition chamber, and
      providing a first doping source to the deposition chamber, and
   the second deposition process includes:
      providing the substrate in the deposition chamber, and
      providing a second doping source to the deposition chamber.

3. The method as claimed in claim 1, wherein the drive-in process is performed at about 800° C. to about 900° C. for about 30 to about 50 minutes under an inert atmosphere.

4. The method as claimed in claim 1, wherein locally heating portions of the substrate, the first doping material layer, and the second doping material layer further includes forming a window layer adjacent to the contact layer at the first surface of the substrate such that the window layer has a lower doping concentration than a doping concentration of the contact layer.

5. The method as claimed in claim 1, further comprising removing the first doping material layer and the second doping material layer after locally heating portions of the substrate, the first doping material layer, and the second doping material layer.

6. The method as claimed in claim 1, further comprising forming an antireflective layer on the substrate after locally heating portions of the substrate, the first doping material layer, and the second doping material layer.

7. The method as claimed in claim 1, further comprising forming a back surface field layer on the second surface of the substrate such that the back surface field layer has the first conductivity type.

8. The method as claimed in claim 2, wherein the first doping source includes $POCl_3$.

9. The method as claimed in claim 2, wherein providing the first doping source includes carrying the first doping source in a carrier such that the first doping source is included at a concentration of about 5 to about 7%.

10. The method as claimed in claim 2, wherein providing the first doping source to the deposition chamber is performed for about 10 to about 20 minutes.

11. The method as claimed in claim 2, wherein the second doping source includes $POCl_3$.

12. The method as claimed in claim 2, wherein providing the second doping source includes carrying the second doping source in a carrier such that the second doping source is included at a concentration of about 10% or greater.

13. The method as claimed in claim 2, wherein providing the second doping source to the deposition chamber is performed for about 3 to about 8 minutes.

14. The method as claimed in claim 2, wherein:
providing the first doping source is performed for a first time period,
providing the second doping source is performed for a second time period, and
the first time period is longer than the second time period.

15. The method as claimed in claim 2, wherein:
providing the first doping source includes carrying the first doping source in one carrier such that the first doping source is included at a first concentration,
providing the second doping source includes carrying the second doping source in another carrier such that the second doping source is included at a second concentration, and
the second concentration is greater than the first concentration.

16. The method as claimed in claim 3, wherein the drive-in process includes forming an emitter layer at the first surface of the substrate.

17. The method as claimed in claim 5, wherein removing the first doping material layer and the second doping material layer includes etching with an acidic solution.

18. A method of manufacturing a solar cell, the method comprising:
providing a semiconductor substrate, the semiconductor substrate having a first conductivity type;
performing a first deposition process, the first deposition process including forming a first doping material layer having a second conductivity type different from the first conductivity type;
rapidly diffusing a dopant of the first doping material layer into the substrate to form an emitter layer at a first surface of the substrate;
performing a second deposition process after rapidly diffusing the dopant, the second deposition process including forming a second doping material layer thereon, wherein:
the second doping material layer has the second conductivity type, and
the first doping material layer together with the second doping material layer have a variable concentration gradient such that a concentration of silicon oxide in the first and second doping material layers is greater in proportion to a proximity with the substrate;
selectively diffusing the dopant of the first and second doping material layers into the emitter layer to form a contact layer at portions of the first surface of the substrate; and
forming a first electrode on the contact layer and a second electrode on a second surface of the substrate opposite to the first surface.

* * * * *